(12) United States Patent
Poddar

(10) Patent No.: US 6,603,199 B1
(45) Date of Patent: Aug. 5, 2003

(54) INTEGRATED CIRCUIT PACKAGE HAVING DIE WITH STAGGERED BOND PADS AND DIE PAD ASSIGNMENT METHODOLOGY FOR ASSEMBLY OF STAGGERED DIE IN SINGLE-TIER EBGA PACKAGES

(75) Inventor: Anindya Poddar, Sunnyvale, CA (US)

(73) Assignee: National Semiconductor Corporation, Sunnyvale, CA (US)

( * ) Notice: Subject to any disclaimer, the term of this patent is extended or adjusted under 35 U.S.C. 154(b) by 14 days.

(21) Appl. No.: 09/724,739

(22) Filed: Nov. 28, 2000

(51) Int. Cl.[7] .............................................. H01L 23/52
(52) U.S. Cl. ...................... 257/691; 257/692; 257/678; 257/687; 257/688; 257/695
(58) Field of Search ................................ 257/691, 692, 257/781, 784, 787; 438/612, 613, 617

(56) References Cited

U.S. PATENT DOCUMENTS

| | | | |
|---|---|---|---|
| 4,745,305 A | 5/1988 | Crafts | 307/475 |
| 5,155,065 A | 10/1992 | Schweiss | 437/209 |
| 6,057,169 A | 5/2000 | Singh et al. | 438/14 |
| 6,329,278 B1 * | 12/2001 | Low et al. | 438/617 |
| 6,414,386 B1 * | 7/2002 | Beaulieu et al. | 257/691 |

* cited by examiner

Primary Examiner—David Nelms
Assistant Examiner—Renee' R Berry
(74) Attorney, Agent, or Firm—Beyer Weaver & Thomas, LLP

(57) ABSTRACT

A single tier cavity down integrated circuit package having a die with outer bond pads and staggered inner bond pads is described. The bond pads of the die are assigned to associated supply rings and bond fingers of the package according to a design methodology where in one embodiment at least all bond pads connected to the supply rings are outer bond pads, and staggered inner bond pads are connected to bond fingers. There is further described a method for assigning bond pads of the die to associated supply rings and bond fingers of the package, as well as, a die having staggered bond pads formed in accordance with the method of the present invention.

11 Claims, 8 Drawing Sheets

INTEGRATED CIRCUIT PACKAGE HAVING DIE WITH STAGGERED BOND PADS AND DIE PAD ASSIGNMENT METHODOLOGY FOR ASSEMBLY OF STAGGERED DIE IN SINGLE-TIER EBGA PACKAGES

FIELD OF THE INVENTION

The present invention relates generally to integrated circuit packages. More specifically, the present invention relates to packaging of die having staggered bond pads into grid array-type integrated circuit packages.

BACKGROUND OF THE INVENTION

Current industry emphasis on decreased size and increased functionality of semiconductor dice has resulted in the continuing development of integrated circuit dice having a high density of active circuits. Conventionally, the logic circuitry of the die is formed on the interior portion of the die and a plurality of input/output (I/O) devices or cells are located around the periphery of the die. Each I/O cell, typically, is connected to at least one bond pad fabricated at the surface of the die that serves as the input/output (I/O) contact for that cell.

Placement of the bond pads along the edges of each side of the die allow for connection, for example, by bonding wires, of the bond pads to electrical contacts on another substrate, such as bonding rings or bond fingers on a package substrate. Bond pads are conventionally arranged in an in-line arrangement or in a staggered arrangement.

FIG. 1 is a diagrammatic illustration of a portion of a die having an in-line arrangement of bond pads. In an in-line arrangement, the bond pads 104 are located along the periphery of the die 102 in a single row. Spacing of the bond pads 104 may be described in terms of a pad pitch, or the center-to-center spacing of the pads. For example, pad pitch 106 of the bond pads 104, may be, for example, 75 microns.

In some other dice, especially high-density dice, the bond pads may be arranged in a staggered arrangement resulting in multiple rows of bond pads located at the edges of the die. Staggering the bond pads permits more bond pads to be located on the die over that of an in-line arrangement. The location of a bond pad interior to the die, e.g., an inner bond pad, relative to the bond pads nearest the edge of the die, e.g., outer bond pads, may be described as being "perfectly" staggered or "non-perfectly" staggered.

FIG. 2 is a diagrammatic illustration of a portion of a die having staggered bond pads in a "perfect" staggered arrangement. As illustrated, the inner bond pads 204 are staggered relative to the outer bond pads 206 in that they are located interior to the die 202 from the outer bond pads 206 and are not "in-line" with the outer bond pads 206. In this example, the inner bond pads 204 are arranged in a "perfect" staggered arrangement relative to the outer bond pads 206 as they are located interior to and directly between the outer bond pads 206, i.e., in the spaces. Although the pad pitch 208 between the outer bond pads 206 may be the same as in the in-line arrangement earlier described with reference to FIG. 1, e.g., 75 microns, the stagger of the additional row of inner bond pads 204 may result in an smaller overall effective pad pitch, for example, 45 microns. Thus, a greater density of bond pads may be located on the same size die with a staggered arrangement of bond pads over that of a die having an in-line arrangement of bond pads.

FIG. 3 is a diagrammatic illustration of a portion of a die having staggered bond pads in a "non-perfect" staggered arrangement. In this example, the inner bond pads 304 of the die 302 are not located directly between the outer bond pads 306, but are horizontally offset relative to the outer bond pads 306 so that, with increasing offset from the space between the outer bond pads 306, portions of the inner bond pads 304 become located behind the outer bond pads 306. The offset may be to such a large degree that an inner bond pad 304 is directly aligned behind an outer bond pad 306.

As a staggered bond pad arrangement on a die provides greater bond pad density over that of most similarly sized die having in-line die arrangements, high-density dice are increasingly being designed with staggered bond pad arrangements. A design consideration, however, with the staggered arrangement is the possibility of wire crossing and shorting between bonding wires exiting from the inner bond pads with those bonding wires exiting from the outer bond pads when the die is attached to another substrate, such as a package substrate.

One type of packaging that is widely used in packaging a high-density die is a grid array-type package. There are many designs of grid array-type packages, for example, pin grid array packages and ball grid array packages. Generally, some packages mount the die on the surface of the package substrate, for example, a plastic ball grid array package; while, some others, mount the die in a die cavity formed in the substrate, for example, an enhanced ball grid array package.

When packaging a die, connections of the die to the conductive layers of the substrate are typically made by wire bonding the bond pad of the die to an associated bonding site, such as bond fingers or bonding rings, on the package substrate. With a die having an in-line arrangement of bond pads, there is usually a low risk of short circuits due to the bonding wires contacting each other as the bond pads are horizontally separated by the spacing between the bond pads and there is no crossing over of bonding wires from inner bond pads.

With a die having a staggered arrangement of bond pads, wire contact between bonding wires from inner bond pads which cross over bonding wires from outer pads is a concern. In some packages, the height of the wire loop of the bonding wire exiting the inner bond pad can be increased over that of the height of the wire loop of the bonding wire exiting the outer bond pad to provide vertical separation. However, in some other packages, this height adjustment can be constrained to such a degree that the particular package design cannot be used in packaging the die.

If the die is packaged in a surface mount package, such as a standard ball grid array package, there is little constraint on the height of the wire loop as the package encapsulant formed over the wire bonds and die can simply be adjusted.

FIG. 4 is diagrammatic illustration of a cross-sectional view of a portion of a ball grid array package having a die with bond pads wire bonded to the package substrate. Package 400 includes a substrate 402 having a die 404 mounted on the top surface. Bond pads 406 are connected to bond fingers (not shown) formed on the surface of the substrate 402 by bonding wires 408. The bond fingers are typically interconnected to associated vias 410 formed through the substrate 402 to provide conductive interconnection of the die 404 to the external package contacts 412. Typically, an encapsulant 416, e.g., a plastic cap, is molded over the die 404 and the bonding wires 408.

As illustrated, the height of the wire loop of the bonding wire 408 is maintained within the encapsulant 416. When assembling a die having staggered bond pads, the wire loop heights may need to be adjusted to prevent the bonding wires from contacting each other. Encapsulation of the bonding wires can be maintained by adjusting the height of the encapsulant 416.

Unfortunately, while this package presents little constraints on loop heights of the bonding wires, it has limited heat dissipation capability. Thus, for dice requiring higher heat dissipation or other package properties, especially high-density dice that utilize staggered bond pads, other package structures have been developed. Many of these designs mount the die within a cavity in the substrate so that the die is thermally connected to a heat dissipating layer of the substrate. The package may then be mounted on another substrate, such as a printed circuit board, so that the heat dissipating layer is facing out.

FIG. 5 is a diagrammatic illustration of a cross-sectional view of a portion of a single-tier thermally enhanced ball grid array-type package having a die mounted in a die cavity formed in the package substrate. Package 500 includes a substrate 502 having a die 504 located in a die cavity 506. The substrate 502 includes a heat dissipating layer 508, such as a copper plate, and the cavity 506 is formed in the surface of the substrate 502 exposing a portion of the heat dissipating layer 508 within the cavity 506. The die 504 is mounted within the die cavity 506 and thermally connected to the heat dissipating layer 508 of the substrate 502. Bond pads 510 on the die 504 may be electrically connected to the substrate 502 by bonding wires 512 to bond fingers (not shown) formed on the top surface of the substrate 502. In some packages, there may be multiple rows of bond fingers. Conductive traces routed across the surface of the substrate 502 electrically interconnect the bond fingers to contact landings (not shown) on which contacts 514, such solder balls, are formed. An encapsulant 516 is formed over the die 504 and bonding wires 512. When the package 500 is interconnected to another substrate, such as a printed circuit board, it is mounted cavity down to allow electrical interconnection of the package through the contacts 514, and heat dissipation through the heat dissipating layer 508.

While this package provides the needed heat dissipation and is commonly inexpensive to manufacture, a minimum clearance height 518 cannot be exceeded by the encapsulant 516 in order that the contacts 514 successfully bond to the other substrate. Thus, any bonding wires 512 also cannot exceed this minimum clearance height 518, as they must be maintained within the encapsulant 516.

When assembling a die having staggered bond pads, this minimum clearance height limits the height of bonding wires. Although different loop heights may be used, these heights are restricted and where bonding wires cross over one another, the vertical separation may be small. Often the encapsulation process results in wire sag which may cause the longer bonding wires to contact other bonding wires that are crossed over. This results in shorting and yield loss during production. Thus, although this form of packaging is inexpensive, it is difficult to use with a die having staggered bond pads as the minimum clearance height restricts the adjustment of loop heights.

Some developers have attempted to assemble staggered die into these packages by utilizing complex wire loops with multiple kinks to effect the use of smaller, more rigid wire "loop" heights, but this process is typically very expensive with poor yields. Other developers have turned to multi-tier enhanced ball grid array packages to avoid the minimum clearance height constraints.

FIG. 6 is a diagrammatic illustration of cross-sectional view of a portion of a multi-tiered thermally enhanced ball grid array-type package having a die with bond pads wire bonded to the package substrate. Package 600 includes a substrate 602 having a die 604 located in a die cavity 606. The substrate 602 may be multi-layered and includes a heat dissipating layer 608, such as a copper slug. The cavity 606 is formed in the surface of the substrate 602 exposing a portion of the heat dissipating layer 608 within the cavity 606. The die 604 is mounted within the die cavity 606 and thermally connected to the heat dissipating layer 608 of the substrate 602. Bond pads 612 of the die 604 are electrically connected to bonding rings or bond fingers, not shown, located on the tiers 616 and 618 of the substrate 602 by bonding wires 614. The bond fingers and bonding rings are connected to external contacts 620, such solder balls, via associated conductive traces and vias formed in the substrate 602. An encapsulant 622 is formed over the die 604 and wire bonds 614 filling the cavity 606. When the package 600 is interconnected to another substrate, such as a printed circuit board, it is mounted cavity down.

As illustrated, there is a greater height within the cavity 606 within which to adjust the loop height of the bonding wires 614. When assembling a die having staggered bond pads, it is much easier to avoid wire contact between bonding wires that cross over by adjusting the loop heights. Further, as many of the bonding wires may be associated with different tiers, the chance of contact between the bonding wires can be further reduced. Thus, the multi-tier package provides the needed heat dissipation, and has reduced wire loop height constraints over that of the single-tier cavity package of FIG. 5, however, a disadvantage of multi-tiered cavity packages is that they are currently about one and a half times more expensive than the single-tier ball grid array package.

Thus, it would desirable to have a method and/or device that would allow assembling of die having staggered bond pads into single-tier thermally enhanced ball grid array packages.

SUMMARY OF THE INVENTION

In accordance with the present invention, there is described an integrated circuit package having a die with outer bond pads and inner bond pads, where at least some of the inner bond pads are staggered relative to the outer bond pads. The package has three supply rings and bond fingers formed external to the third supply ring. The bond pads of the die are connected to associated supply rings and bond fingers of the package according to a design methodology where, in one embodiment, at least all bond pads connected to the supply rings are outer bond pads, and the staggered inner bond pads are connected to bond fingers. The loop height of the bonding wires from the outer bond pads connected to the supply rings is lower than the loop height of the bonding wires from the staggered inner bond pads to prevent wire contact.

According to another embodiment, there is described a method for assigning and positioning the bond pads of the die to allow assembly of the die into a single-tier package and to prevent wire contact.

According to a further embodiment, there is described a die having outer bond pads and staggered inner bond pads, formed in accordance with the method of the present invention.

BRIEF DESCRIPTION OF THE DRAWINGS

The present invention may best be understood by reference to the following description taken in conjunction with the accompanying drawings in which:

FIG. 11 illustrates a bond pad sequence used in describing placement of staggered inner bond pads such that their bonding wires exit over outer bond pads that are connected to the supply rings 802 and 804 according to one embodiment of the present invention.

DETAILED DESCRIPTION OF THE INVENTION

According to the present invention, there is described a single-tier integrated circuit package having a die with staggered bond pads, methods for assigning bond pads of a die having staggered bond pads, and a die having staggered bond pads.

In the following description, numerous specific details are set forth in order to provide a thorough understanding of the present invention. It will be appreciated, however, to one skilled in the art, that the present invention may be practiced without some or all of these specific details. In other instances, well-known integrated circuit and package fabrication and assembly techniques have not been described in detail in order not to unnecessarily obscure the present invention.

Figure 1:
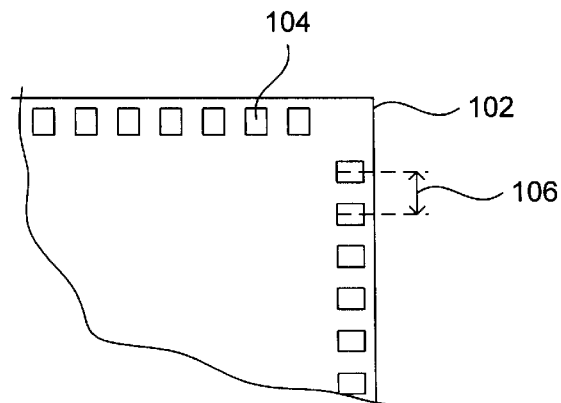
FIG. 1 is a diagrammatic illustration of a portion of a die having an in-line arrangement of bond pads.
Figure 2:
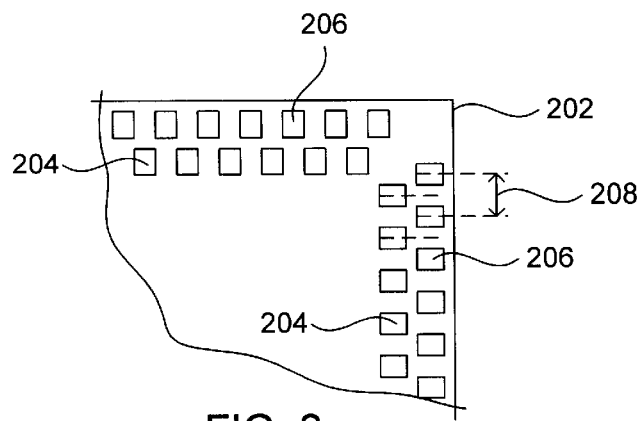
FIG. 2 is a diagrammatic illustration of a portion of a die having staggered bond pads in a "perfect" staggered arrangement.
Figure 3:
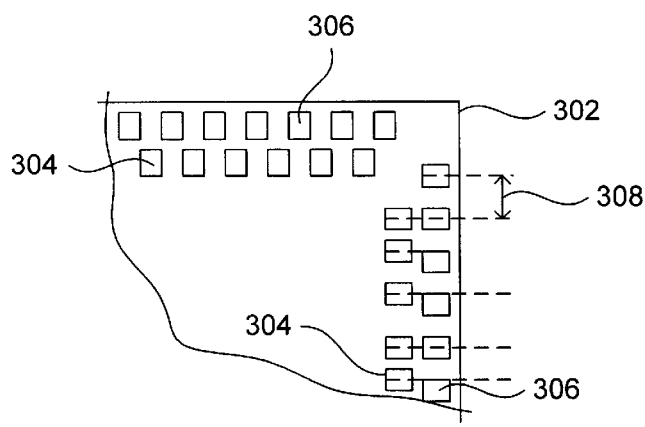
FIG. 3 is a diagrammatic illustration of a portion of a die having staggered bond pads in a "non-perfect" staggered arrangement.
Figure 4:
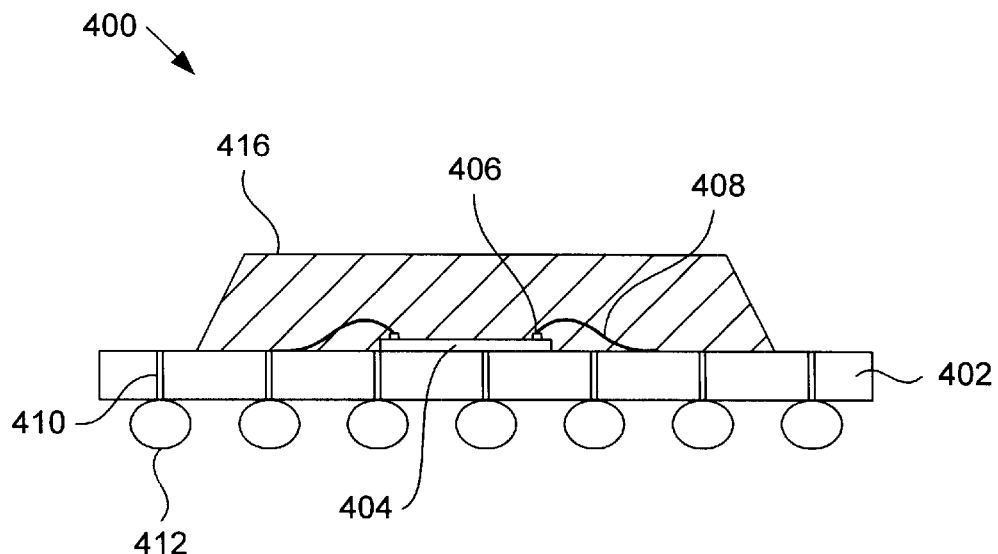
FIG. 4 is diagrammatic illustration of a cross-sectional view of a portion of a ball grid array-type package having a die with bond pads wire bonded to the package substrate.
Figure 5:
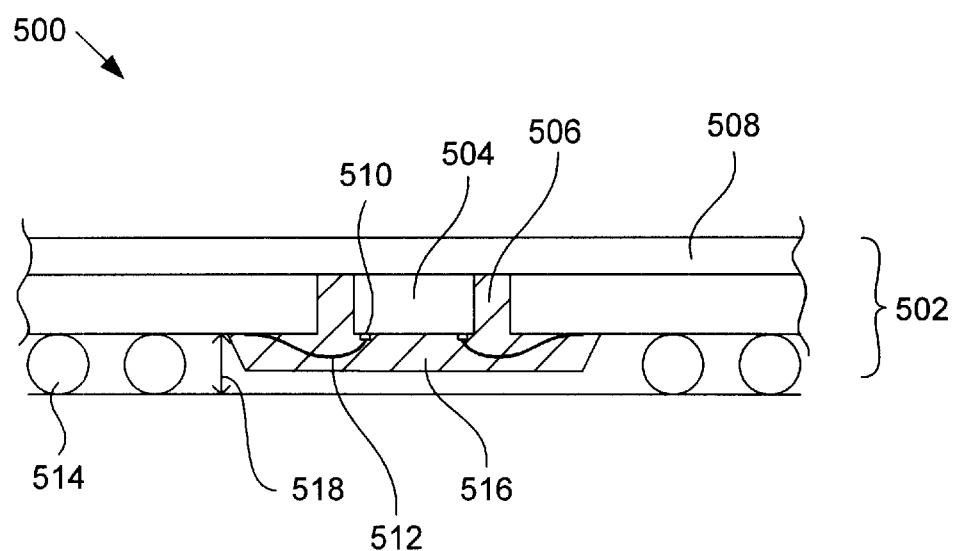
FIG. 5 is a diagrammatic illustration of a cross-sectional view of a portion of a single-tier thermally enhanced ball grid array-type package having a die mounted in a die cavity formed in the package substrate.
Figure 6:
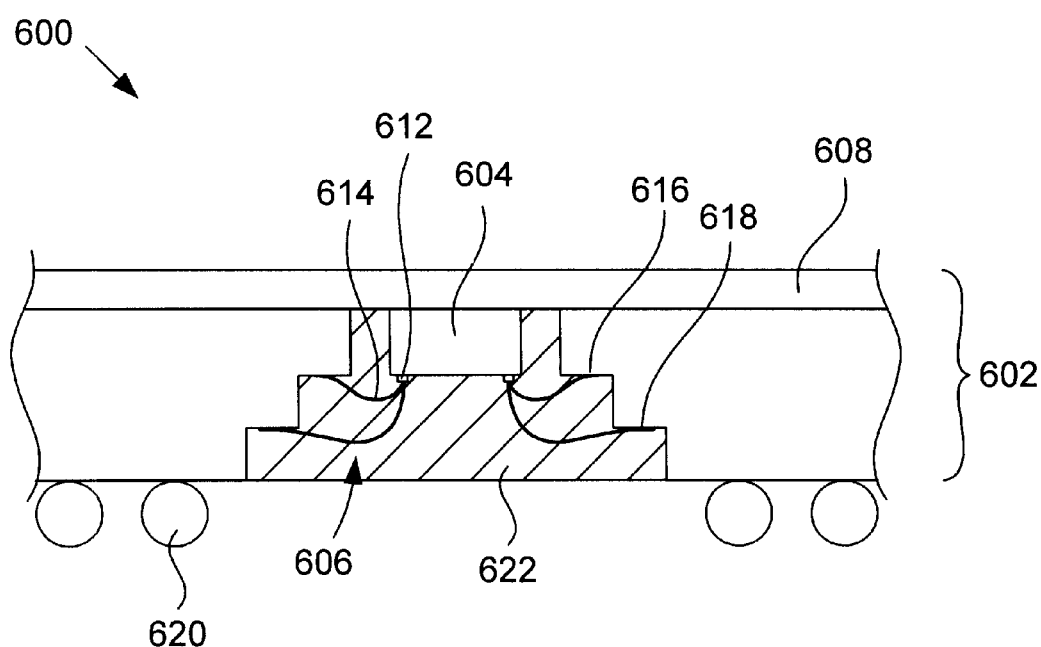
FIG. 6 is a diagrammatic illustration of cross-sectional view of a portion of a multi-tiered thermally enhanced ball grid array-type package having a die with bond pads wire bonded to the package substrate.
Figure 7:
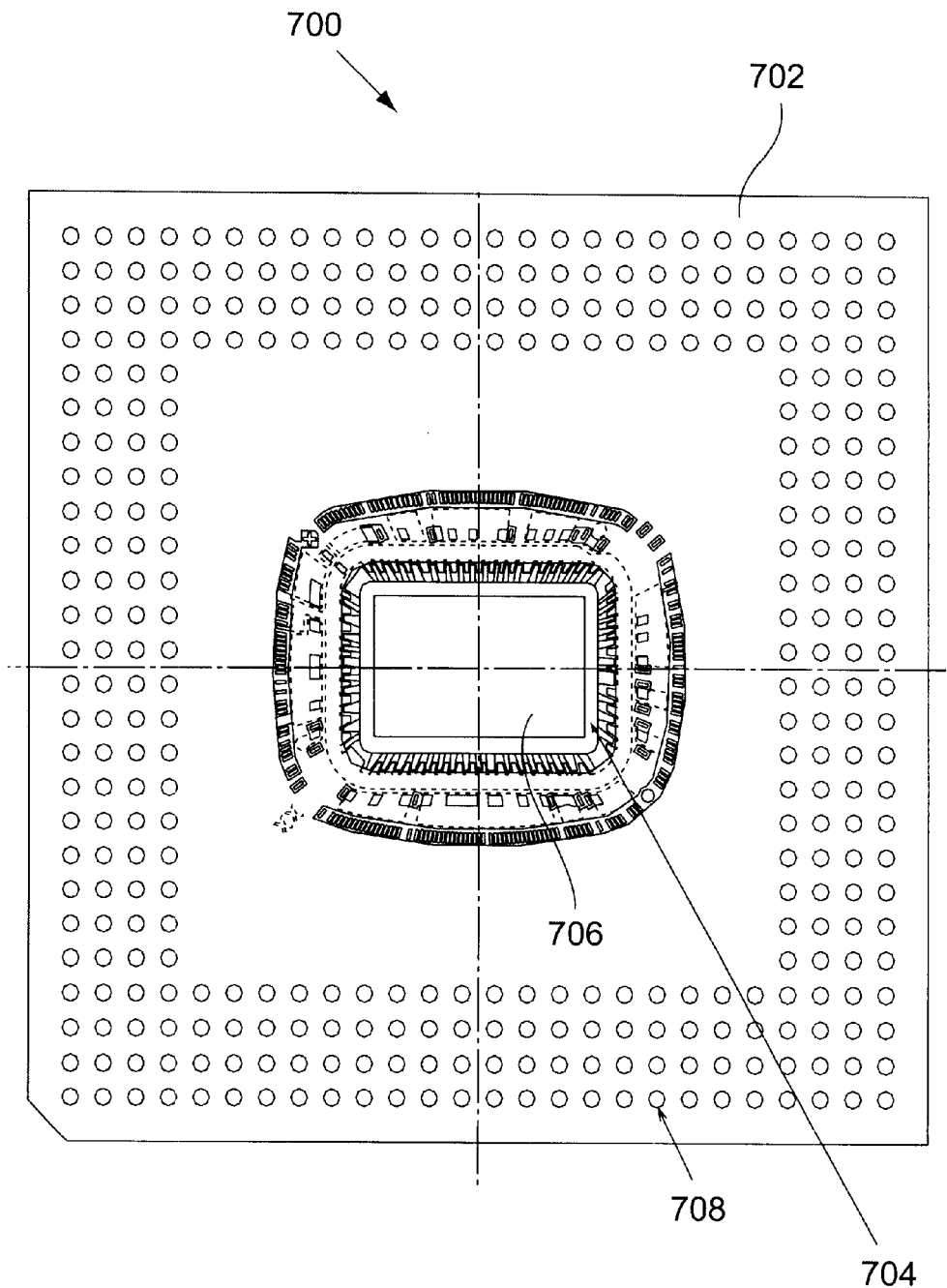
FIG. 7 is a diagrammatic illustration of a top view of a single-tier enhanced ball grid array cavity package according to one embodiment of the present invention.

FIG. 7 is a diagrammatic illustration of a top view of a single-tier enhanced ball grid array cavity package according to one embodiment of the present invention. As illustrated, package 700 includes a substrate 702 having a single-tier die cavity 704 formed in the surface, exposing an underlying heat dissipating layer, such as a copper slug, on which a die 706 is mounted. The substrate 702 further includes first, second and third supply rings that surround the die cavity 704 and a multiplicity of bond fingers located outside of the supply rings, which are further described herein with reference to FIG. 8.

In one embodiment, the die 706 has outer bond pads and staggered inner bond pads. The outer and staggered inner bond pads of the die 706 are selectively connected by bonding wires (not shown) to the first, second, and third supply rings and bond fingers as further described herein with reference to FIG. 9 and TABLE 1. The first, second, and third supply rings and bond fingers are interconnected through associated trace routings and/or conductive vias to contact lands 708 on which package contacts (not shown), such as solder balls, are formed. An encapsulant (not shown) is formed over at least a portion of the die 706 and bonding wires. As earlier discussed, both the bonding wires and encapsulant must be maintained within a minimum clearance height to allow the package contacts to be coupled to another substrate.

Figure 8:
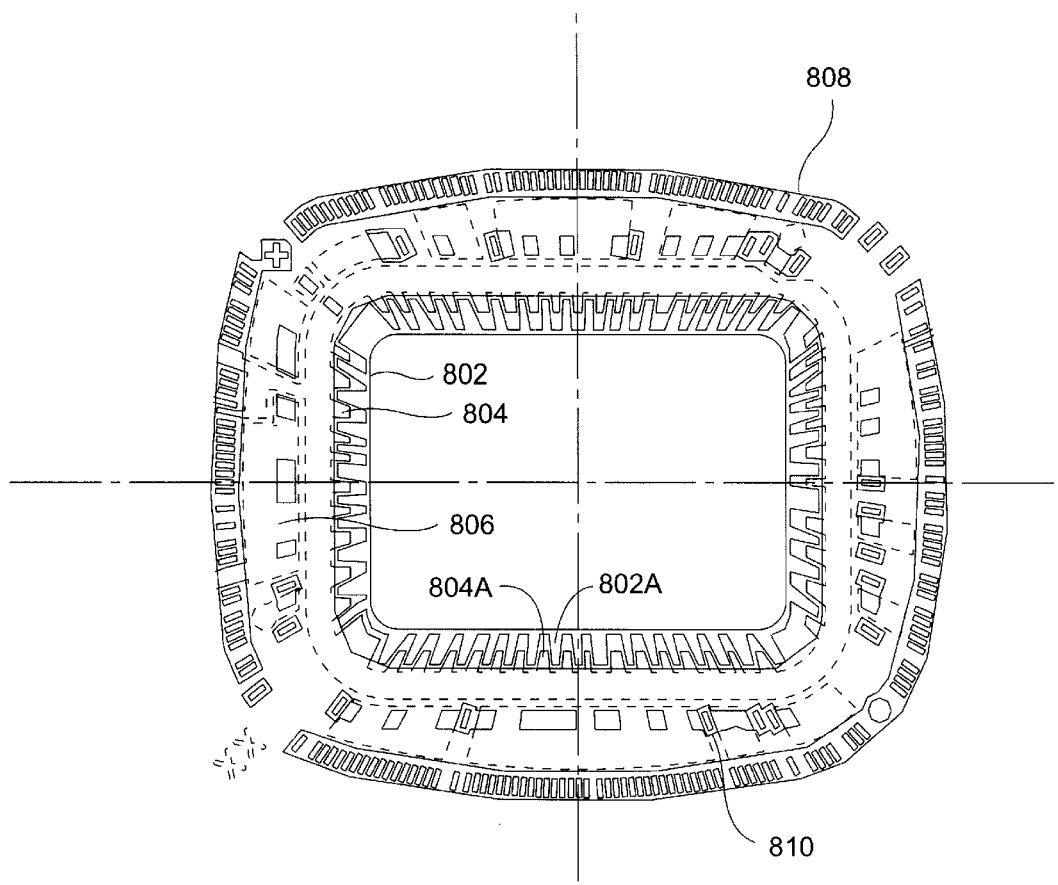
FIG. 8 is an enlarged diagrammatic illustration of a top view of the first, second and third supply rings and the bond fingers of FIG. 7 according to one embodiment of the present invention.

FIG. 8 is an enlarged diagrammatic illustration of a top view of the first, second and third supply rings and the bond fingers of FIG. 7 according to one embodiment of the present invention. As illustrated, the substrate 702 includes two inner rings, a first supply ring 802 and a second supply ring 804, and an outer third supply ring 806 which are internal to bond fingers 808.

In one embodiment, the first supply ring 802 and the second supply ring 804 may be interdigitated rings that are interleaved to form ring extensions 802A and 804A, respectively. To accommodate die placement tolerances, the wide ring extensions 802A and 804A are about twice as wide as the bond fingers 808, as shorter bonding wires which connect to the rings 802 and 804 are more sensitive to shifts in die placement than longer bonding wires which connect to the bond fingers 808. In one embodiment, the first supply ring 802, second supply ring 804, and third supply ring 806 may carry supplies such as ground or power, for example, VSS, VDDIO and VDD, respectively.

In some embodiments, the outer third supply ring 806 may be a continuous ring. In other embodiments, discussed further herein with reference to TABLE 1, the third supply ring 806 may be split and the substrate 702 may further include intermediate bond fingers 810 formed in the split and aligned with the third supply ring 806.

As earlier described, assembly of a die having staggered bond pads into a single-tier cavity package is typically constrained by the minimum clearance height that must be maintained to allow the package contacts to couple to another substrate. Accordingly, one embodiment of the present invention provides a method for assembling a die having staggered bond pads in a single-tier cavity package, as described with reference to FIGS. 7 and 8.

Figure 9:
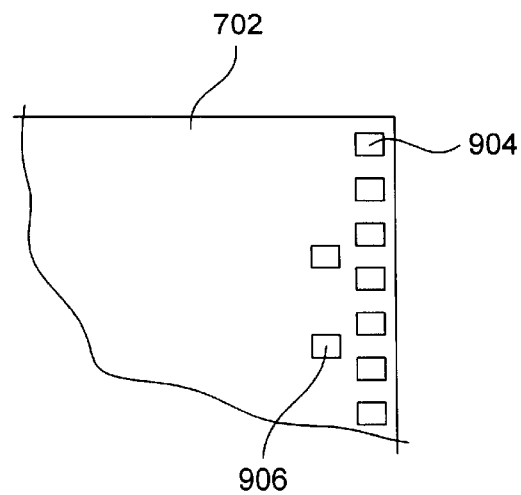
FIG. 9 is a diagrammatic illustration of a top view of a portion of the die 702 having outer bond pads and inner bond pads where at least some of the inner bond pads are staggered relative to the outer bond pads according to one embodiment of the present invention.

FIG. 9 is a diagrammatic illustration of a top view of a portion of the die 702 having outer bond pads and staggered inner bond pads according to one embodiment of the present invention. As illustrated, the die 702 includes outer bond pads 904 and staggered inner bond pads 906. Assignment and positioning of the bond pads 904 and 906 on the die 702 is further described herein with reference to TABLE 1.

TABLE 1

| | | |
|---|---|---|
| 1.1 | | ALL BOND PADS BONDED TO SUPPLY RINGS ARE OUTER BOND PADS. |
| 1.2. | | OUTER BOND PADS BONDED TO SUPPLY RINGS ARE UNIFORMLY DISTRIBUTED |
| 1.3. | | BOND PADS THAT CARRY CRITICAL SIGNALS MAY BE OUTER BOND PADS AND ARE LOCATED TOWARD THE CENTER OF THE EDGE OF THE DIE. |
| 1.4. | | BOND PADS CARRYING CRITICAL SIGNALS ARE PLACED NEXT TO BOND PADS CARRYING SUPPLIES. |
| 1.5. | | SIGNALS THAT NEED IMPEDANCE/INDUCTANCE MATCHING ARE ASSIGNED ADJACENT EXTERNAL PACKAGE CONTACTS ON THE SAME ROW. |
| 1.6. | | THE NUMBER OF OUTER BOND PADS IS MAXIMIZED OR ONLY OUTER BOND PADS CARRY SUPPLIES AND STAGGERED INNER BOND PADS CARRY ALL SIGNALS. |
| 1.7. | | THE PACKAGE RING STRUCTURE MAY UTILIZE INTERDIGITATED RINGS |
| 1.8. | | PLACEMENT OF STAGGERED INNER BOND PADS: |
| | 1.8.1 | FIRST THREE BOND PADS ON THE CORNER OF THE DIE ARE OUTER BOND PADS FOR ALL EDGES. |
| | 1.8.2 | STAGGERED INNER BOND PADS POSITIONED SO THEIR BONDING WIRES EXIT OVER OUTER BOND PADS THAT ARE CONNECTED TO THE TWO INNER SUPPLY RINGS AND LOOP HEIGHTS OF BONDING WIRES CONNECTED TO THE INNER SUPPLY RINGS IS LOWER THAN THE LOOP HEIGHT FOR BONDING WIRES CONNECTED TO THE BOND FINGERS. |
| | 1.8.3 | IF NOT 1.8.2, A STAGGERED INNER BOND PAD CONNECTED TO A BOND FINGER CAN BE LOCATED BEHIND AN OUTER BOND PAD CONNECTED TO THE OUTER THIRD SUPPLY RING. |
| | 1.8.4 | IF NEITHER 1.8.2 NOR 1.8.3, A STAGGERED INNER BOND PAD CONNECTED TO A BOND FINGER CAN BE LOCATED BEHIND AN OUTER BOND PAD CONNECTED TO A BOND FINGER AND THE OUTER THIRD SUPPLY RING IS SPLIT AND A BOND FINGER PULLED INTO THE SPLIT. |
| | 1.8.4.1 | IF TWO OUTER SIGNAL BOND PADS CONNECTED TO BOND FINGERS ARE SEPARATED BY AN OUTER BOND PAD CONNECTED TO THE OUTER THIRD SUPPLY RING, THEN THE TWO OUTER SIGNAL BOND PADS CONNECTED TO BOND FINGERS ARE FIVE OUTER BOND PADS APART. |

TABLE 1 describes the outline of a method for assigning and positioning bond pads of a die having staggered bond pads to allow assembling of the die into a single-tier cavity ball grid array package as described with reference to FIGS. 7, 8 and 9 according to one embodiment of the present invention. The order shown in TABLE 1 does not ascribe a particular order to the methodology, but where a particular guideline is preferably considered at the start of the design, it will be noted.

Referring to 1.1, all bond pads which are bonded to supply rings 802, 804, or 806 in the package are outer bond pads 904. Continuing the earlier example, all VSS, VDD, and VDDIO bond pads would be outer bond pads 904. This may also be applied to any bond option signals, i.e., either bonded as a signal or bonded to one of the supplies, which may be bonded to the supply rings in the final production bondout.

These outer bond pads 904 which are bonded to the supply rings, referring to 1.2, are uniformly distributed on all sides of the die 702. For example, VSS, VDD, and VDDIO outer bond pads should be distributed uniformly on each of the sides of the die 702.

Referring to 1.3, all bond pads that carry critical signals should be located toward the center of the edges of the die 702 and may be outer bond pads 904. This results in the shortest bonding wires and shortest traces and maximizes the chances of making the critical traces 2×(twice as) wide and/or with maximum isolation.

Bond pads carrying critical signals, referring to 1.4, should be placed adjacent to bond pads carrying supplies to provide a reference and for isolation.

Referring to 1.5, signals that need impedance/inductance matching should be assigned adjacent external package contacts, i.e., solder balls, on the same row so their lengths are nearly the same. Referring to FIG. 7, these signals would need to be assigned adjacent contact lands 708 (on which an external contact is formed) in the same row. Thus, although the methodology of the present invention requires no particular order, it is preferred that all such signals be identified before the design begins.

Referring to 1.6, if signal bond pads must be outer bond pads 904, then the number of outer bond pads 904 should be maximized. Alternatively, all signals bond pads may be staggered inner bond pads 906 and then only supplies should be outer bond pads 904. In this case, the staggered inner bond pads 906 should be maximized.

Referring to 1.7, in order to minimize the lengths of the bonding wires, the ring structure of the package should make use of interdigitated rings. In the present embodiment, package 700 includes interdigitated supply rings 802 and 804. As earlier described with reference to FIG. 8, the ring extensions 802A and 804A are wide. Thus, outer bond pads 904 which connect to the rings 802 and 804 need some separation to provide adequate spacing. In the present embodiment, to provide this spacing, a minimum of two outer bond pads 904 which are connected to a bond finger 808 or to supply ring 806 should be located between any outer bond pad 904 bonded to rings 802 and 804.

For example, sequence A would be acceptable for outer bond pads 904 of the die 702, but not sequence B.

Sequence A: SIG, VSS, SIG, SIG, SIG, VDDIO, VDD, SIG, VSS, VDD, SIG, VDDIO, VDDIO, SIG, SIG, VSS, VSS Sequence B: SIG, VSS, <u>SIG</u>, VDDIO, SIG, SIG, SIG, VSS, VDDIO, <u>SIG</u>, VSS, SIG, VDDIO, VDDIO, <u>VDD</u>, VSS, SIG In sequence B, the italicized bond pad assignments indicate where the spacing is not adequate, and the underlined bond pad assignments indicate assignments that should be avoided wherever possible.

Referring to 1.8, due to the package thickness limitation, e.g., the minimum clearance height, the number of bonding wire loop heights is limited to two, and thus, staggered inner bond pads 906 need to be positioned with caution. Thus, when placing staggered inner bond pads 906, the following methodology should be followed.

Referring to 1.8.1, the three bond pads along each edge of the die 702 that are closest to each corner of the die 702 are outer bond pads 904.

Referring to 1.8.2, the staggered inner bond pads 906 should be positioned such that their bonding wires exit over outer bond pads 904 that are connected to supply rings 802 and 804, and the loop heights of the bonding wires connected to the supply rings 802 and 804 is lower than the loop height of bonding wires connected to the bond fingers 808. This allows for vertical spatial separation, even though the bonding wires may appear to cross in a plan view.

Figure 10:
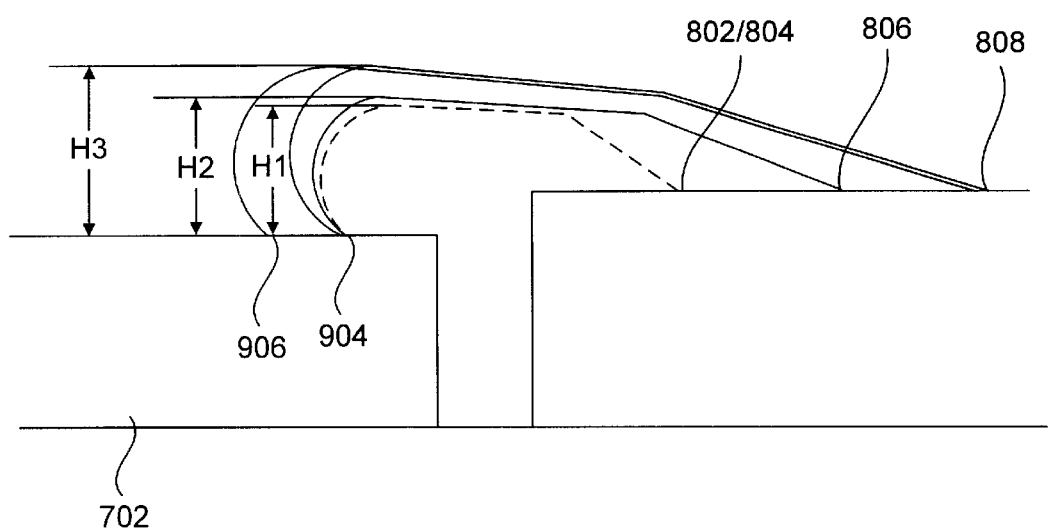
FIG. 10 is a diagrammatic illustration showing different loop heights of bonding wires from the staggered inner and outer bond pads of the die according to one embodiment of the present invention.

FIG. 10 is a diagrammatic illustration showing different loop heights of bonding wires from the staggered inner and outer bond pads of the die according to one embodiment of the present invention. As illustrated, the loop height, H1, of the bonding wire from the outer bond pad 906 that connects to supply rings 802 or 804 is lower than the loop height, H2 to ring 806, which is lower than loop height H3, of the bonding wire from the staggered inner bond pad wire 906 that connects to a bond finger 808. It follows that if all bond pads that are connected to supply rings are outer bond pads 904, that the inner bond pads 906 are signal pads and connect to bond fingers 808. Thus, inner bond pads 906 have bonding wires with a loop height of H3. Outer bond pads 904, however, may be either supplies or signals, and many connect to supply rings 802, 804, or 806, or to bond fingers 808, and thus, may have bonding wires with a loop height of H1, H2, or H3. As the shorter bonding wires, e.g., bonding wires to the supply rings 802 and 804, are least susceptible to sway or sweep caused during the assembly process, wire crossing by bonding wires from the inner bond pad 906 is acceptable. In one embodiment, loop height H1, may be in the range of 4 mils to 5 mils; loop height H2, may be in the range of 6 mils to 7 mils, and loop height H3, may be in the range from 8 mils to 10 mils.

FIG. 11 illustrates a bond pad sequence used in describing placement of staggered inner bond pads such that their bonding wires exit over outer bond pads that are connected to the supply rings 802 and 804 according to one embodiment of the present invention. In the illustration, 1–3, 5, 7, 9–11, 50–52, 54, 56, and 58–60 represent outer bond pads 904 of the die 702, and 4, 6, 8, 53, 55, and 57 represent inner bond pads 906 of the die 702. In FIG. 11, 1 is near the left edge of the die 702 and 60 is near the right edge of the die 702. Since the bonding wire is fanned out on the left edge, the wire from bond pad 4 will exit over or near the wire from pad 3, and likewise pads 6-5, 8-7, etc. The situation is exactly reversed on the right edge where the bonding wire from bond pad 53 exits over or near the wire from bond pad 54, and likewise pads 55–56, 57–58. Here it is desirable that bond pads 3, 5, 7, 54, 56, and 58 are connected to the supply rings 802 or 804. Bond pads 9 and 52 can be signal bond pads, e.g., connected to bond fingers 808, since there are no staggered inner bond pads 906 behind them.

Referring to 1.8.3, if it is not possible to have the staggered inner bond pads 906 located behind outer bond pads 904 that are connected to supply rings 802 and 804, alternatively, the staggered inner bond pads 906 can be positioned behind outer bond pads 904 connected to supply ring 806. Although the bonding wires connecting to the supply ring 806 may have a greater likelihood of shorting with the bonding wires exiting from the staggered inner bond pads 906, especially if they run parallel for the entire length of the wire, there is still a separation in the Z direction.

In the event neither of the above situations is feasible and a staggered inner bond pad 906 connected to a bond finger 808 must be placed behind an outer bond pad 904 to be connected to a bond finger 808, then, referring to 1.8.4, that outer bond pad 904 should be separated from any outer bond pad 904 connected to the supply ring 806 by at least one other outer bond pad 904 connected to a bond finger 808. This allows the supply ring 806 to be split and a bond finger 808 to be "pulled in" so it is in line with the supply ring 806, i.e., the pulled in bond finger may be termed an intermediate bond finger. The wire loop of the bonding wire from the outer bond pad 904 connected to this intermediate bond finger is then similar to the loops of the other bonding wires attached to the supply ring 806.

Referring to 1.8.4.1, if two outer bond pads 904 of the type described above, e.g., connected to intermediate bond fingers, are separated by an outer bond pad 904 connected to supply ring 806, then those two outer bond pads 904 should preferably be five outer bond pads apart from one another.

Figure 12:
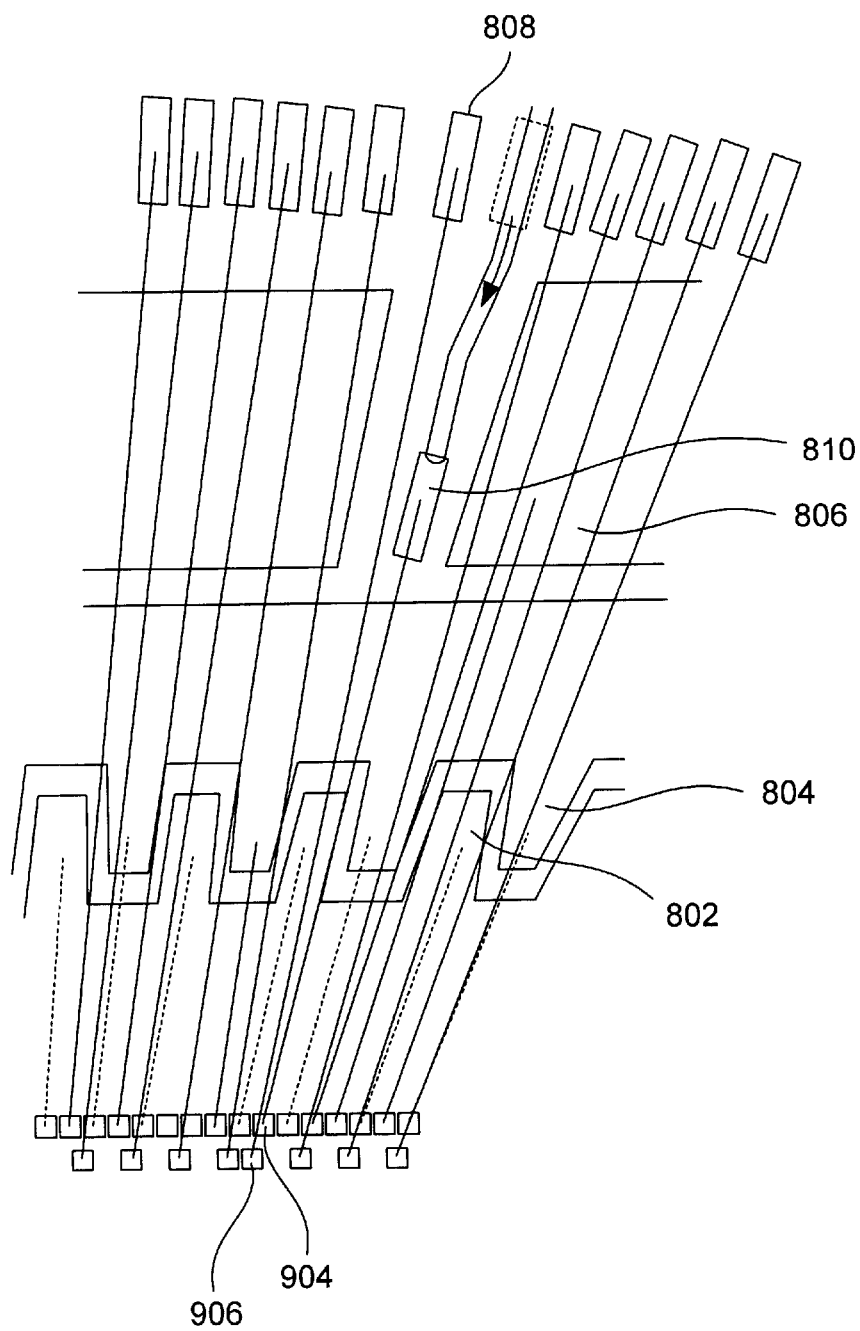
FIG. 12 is a diagrammatic illustration showing an outer bond pad connected to a bond finger that has been "pulled in" to a space formed by splitting the supply ring 806 according to one embodiment of the present invention.

FIG. 12 is a diagrammatic illustration showing an outer bond pad connected to a bond finger that has been "pulled in" to a space formed by splitting the supply ring 806 according to one embodiment of the present invention. As illustrated, staggered inner bond pad 906 connects to a bond finger 808, and outer bond pad 904 connects to an intermediate bond finger 810 pulled in to a position in line with the supply ring 806. This permits the wire loop of the bonding wire connecting the outer bond pad 904 to the intermediate bond finger 810 to be similar in height to the loops of the other bonding wires attached to the supply ring 806.

Thus, as described, the present invention permits assembly of die having staggered bond pads into a single-tier integrated circuit package without use complex bonding wire loops with multiple kinks and mitigates bonding wire contact by utilizing a bond pad assignment methodology which designs in a separation of the bonding wires exiting the staggered inner and outer bond pads.

Although the foregoing invention has been described in some detail for purposes of clarity of understanding, it will be apparent that certain changes and modifications may be practiced within the scope of the appended claims. Therefore, the described embodiments should be taken as illustrative and not restrictive, and the invention should not be limited to the details given herein but should be defined by the following claims and their full scope of equivalents.

I claim:

1. An integrated circuit package comprising:
   a substrate having a die cavity, first, second and third supply rings that surround the die cavity and a multiplicity of bond fingers located outside of the supply rings;
   a die mounted in the die cavity, the die having inner and outer bond pads, wherein at least some of the inner bond pads are staggered relative to the outer bond pads; and
   a multiplicity of bonding wires that electrically couple the inner and outer bond pads of the die to associated supply rings or bond fingers on the substrate, wherein all of the bonding wires that are coupled to the first, second or third supply rings are coupled to outer bond pads.

2. The integrated circuit package as recited in claim 1 wherein the cavity is a single-tier cavity, and the substrate further comprises:
   a plurality of contacts formed on a surface of the substrate, the contacts interconnected to said bond fingers and supply rings via associated traces and conductive vias formed in the substrate, the external contacts for electrically coupling the package to another substrate; and an encapsulant covering at least a portion of the die and bonding wires.

3. The integrated circuit package as recited in claim 1 wherein the first and second supply rings are interdigitated to form interleaved bonding extensions.

4. The integrated circuit package as recited in claim 1 wherein at least the third supply ring is a split ring, the substrate further including at least one intermediate bond finger that extends between split portions of at least the third supply ring, wherein each bonding wire associated with an intermediate bond finger is coupled to an outer bond pad and wherein the outer bond pad coupled to the intermediate bond finger is separated from any outer bond pad coupled to the third supply ring by at least one outer bond pad coupled to a bond finger.

5. The integrated circuit package as recited in claim 1 wherein the three bond pads along each edge of the die that are closest to each corner of the die are outer bond pads.

6. The integrated circuit package as recited in claim 1, wherein a bond finger having bonding wires coupled to two bond pads is coupled to two adjacent bond pads.

7. The integrated circuit package as recited in claim 1 wherein bond fingers carrying critical signals are located toward the center of the edges of the die and adjacent to supply bond pads.

8. The integrated circuit package as recited in claim 1 wherein all supplies are outer bond pads and all staggered inner bond pads carry signals.

9. A die for assembly into an integrated circuit package having a plurality of supply rings surrounding a die cavity, and a plurality of signal bond fingers external to the supply rings, the die comprising:

a plurality of outer bond pads, and a plurality of inner bond pads staggered relative to the outer bond pads, wherein all supplies are outer bond pads, and all staggered inner bond pads carry signals.

10. The die as recited in claim 9 wherein the three bond pads along each edge of the die that are closest to each corner of the die are outer bond pads.

11. The die as recited in claim 9 wherein bond pads that carry critical signals are located toward the center of the edges of the die and adjacent to bond pads carrying supplies.

* * * * *